United States Patent
Arbel et al.

(10) Patent No.: US 10,719,452 B2
(45) Date of Patent: Jul. 21, 2020

(54) HARDWARE-BASED VIRTUAL-TO-PHYSICAL ADDRESS TRANSLATION FOR PROGRAMMABLE LOGIC MASTERS IN A SYSTEM ON CHIP

(71) Applicant: Xilinx, Inc., San Jose, CA (US)

(72) Inventors: Ygal Arbel, Morgan Hill, CA (US); Sagheer Ahmad, Cupertino, CA (US); Gaurav Singh, Los Altos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/016,349

(22) Filed: Jun. 22, 2018

(65) Prior Publication Data

US 2019/0391929 A1 Dec. 26, 2019

(51) Int. Cl.
*G06F 12/1027* (2016.01)
*H03K 19/1776* (2020.01)

(52) U.S. Cl.
CPC ..... *G06F 12/1027* (2013.01); *H03K 19/1776* (2013.01); *G06F 2212/1016* (2013.01); *G06F 2212/68* (2013.01)

(58) Field of Classification Search
None
See application file for complete search history.

(56) References Cited

U.S. PATENT DOCUMENTS

| | | |
|---|---|---|
| 5,726,584 A | 3/1998 | Freidin |
| 7,254,691 B1 | 8/2007 | Ebeling |
| 7,500,060 B1 | 3/2009 | Anderson et al. |
| 7,620,780 B1 | 11/2009 | Anderson |
| 7,996,649 B1 | 8/2011 | Asserhall |
| 8,015,386 B1 | 9/2011 | Kulkarni et al. |
| 9,356,602 B1 | 5/2016 | Bielich et al. |
| 9,495,302 B2 | 11/2016 | Ahmad |
| 9,720,868 B2 | 8/2017 | Arbel et al. |
| 2015/0161057 A1 | 6/2015 | Zeng et al. |
| 2018/0004678 A1 | 1/2018 | Bogusz et al. |

OTHER PUBLICATIONS

Arm Limited: "MMU-401 System Memory Management Unit Technical Reference Manual", Mar. 14, 2013 (Mar. 14, 2013), XP055377833, Retrieved from the Internet: URL:http://infocenter.arm.com/help/topic/com.arm.doc.ddi0521 a/ 0010521A_corelink_mmu_401_r0p0_trm.pdf.

*Primary Examiner* — Brian R Peugh
(74) *Attorney, Agent, or Firm* — Patterson + Sheridan, LLP

(57) ABSTRACT

An example programmable integrated circuit (IC) includes a processing system having a processor, a master circuit, and a system memory management unit (SMMU). The SMMU includes a first translation buffer unit (TBU) coupled to the master circuit, an address translation (AT) circuit, an AT interface coupled to the AT circuit, and a second TBU coupled to the AT circuit, and programmable logic coupled to the AT circuit in the SMMU through the AT interface.

19 Claims, 8 Drawing Sheets

US 10,719,452 B2

HARDWARE-BASED VIRTUAL-TO-PHYSICAL ADDRESS TRANSLATION FOR PROGRAMMABLE LOGIC MASTERS IN A SYSTEM ON CHIP

TECHNICAL FIELD

Examples of the present disclosure generally relate to electronic circuits and, in particular, to hardware-based virtual-to-physical address translation for programmable logic (PL) masters in a system on chip (SoC).

BACKGROUND

Advances in integrated circuit technology have made it possible to embed an entire system, such as including a processor core, a memory controller, and a bus, in a single semiconductor chip. This type of chip is commonly referred to as a system-on-chip (SoC). Other SoCs can have different components embedded therein for different applications. The SoC provides many advantages over traditional processor-based designs. It is an attractive alternative to multi-chip designs because the integration of components into a single device increases overall speed while decreasing size. The SoC is also an attractive alternative to fully customized chips, such as an application specific integrated circuit (ASIC), because ASIC designs tend to have a significantly longer development time and larger development costs. A configurable SoC (CSoC), which includes a processing system (PS) and programmable logic (PL), has been developed to implement a programmable semiconductor chip that can obtain benefits of both programmable logic and SoC.

An application processor in a PS of an SoC includes a built-in memory management unit (MMU) that provides for virtual-to-physical address translation. In addition, the PS can include a system MMU (SMMU) for use by other PS masters without a built-in MMU. In addition, PL masters can also use the PS SMMU for virtualization, but only by having their traffic routed through the PS, which may be undesirable in some applications. For example, one class of PL masters are circuits with internal caches. Such PL masters require address translation prior to the cache access and therefore cannot route their traffic through the PS for the purpose of using the PS SMMU.

SUMMARY

Techniques for hardware-based virtual-to-physical address translation for programmable logic (PL) masters in a system on chip (SoC) are described. In an example, a programmable integrated circuit (IC) includes: a processing system having a processor, a master circuit, and a system memory management unit (SMMU), the SMMU including: a first translation buffer unit (TBU) coupled to the master circuit; an address translation (AT) circuit; an AT interface coupled to the AT circuit; and a second TBU coupled to the AT circuit; and programmable logic coupled to the AT circuit in the SMMU through the AT interface.

In another example, a circuit in a programmable integrated circuit (IC) includes: programmable logic (PL) having a PL master circuit; and a processing system (PS) having a system memory management unit (SMMU), the SMMU including: an address translation (AT) circuit; an AT interface coupled between the PL master circuit and the AT circuit; and a translation buffer unit (TBU) coupled to the AT circuit.

In another example, a method of address translation in a programmable integrated circuit (IC) includes: receiving, at a system memory management unit (SMMU) in a processing system (PS) of the programmable IC, a request to translate a virtual address from a master circuit in programmable logic (PL) of the programmable IC; translating the virtual address at the SMMU; and sending a translated address from the SMMU to the master circuit in the PL.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
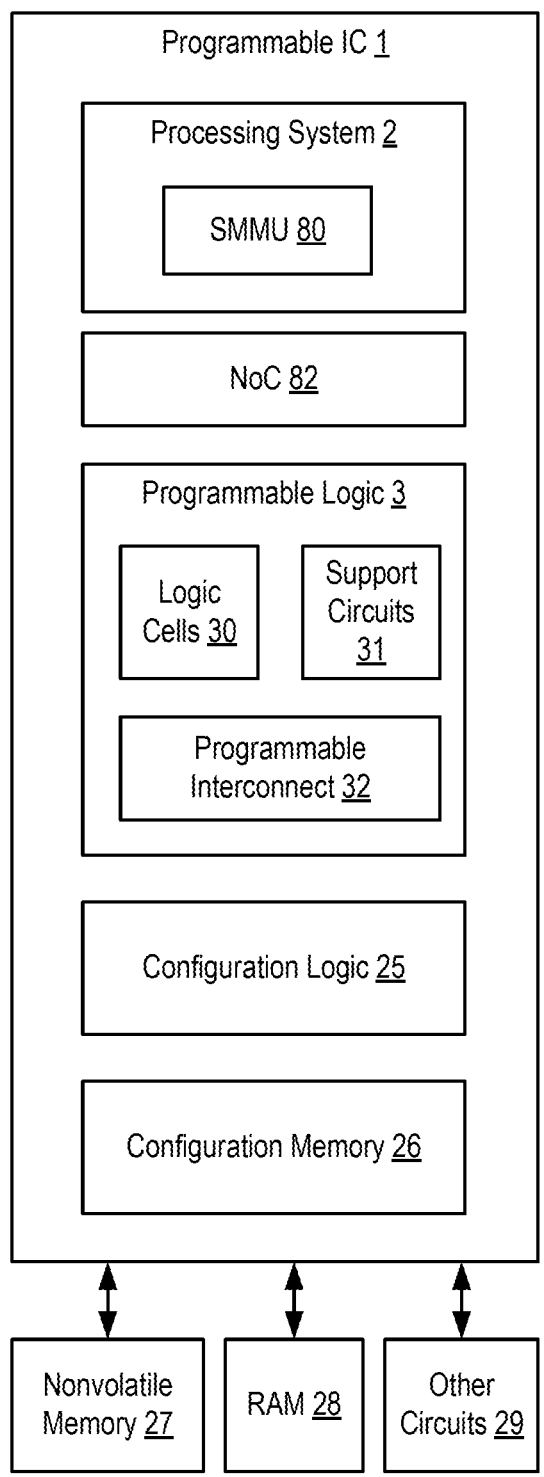
FIG. 1 is a block diagram depicting a programmable integrated circuit according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for hardware-based virtual-to-physical address translation for programmable logic (PL) masters in a system on chip (SoC) are described. The techniques utilize a system memory management unit (SMMU) in a processing system (PS) of the SoC. The hardware-based, low latency techniques provide address translation services to PL masters that make it possible for PL masters to implement internal caches, and can also be used to design virtualized PL masters whose traffic need not be routed via the PS SMMU. In examples, the PS SMMU is extended by adding an additional port. No traffic flows via the added port other than for address translation requests. The PS SMMU includes an address translator coupled to the additional port, which provides a pure address translation service. The PS SMMU includes an address translation interface to attach PL masters to the address translator function. The added port, the address translation function, and the address translation interface operate in the PL clock domain, eliminating latency due to clock domain crossing. These and further aspects are discussed below with respect to the drawings.

FIG. 1 is a block diagram depicting a programmable IC 1 according to an example. The programmable IC 1 includes a processing system 2, programmable logic 3, a network on chip (NoC) 82, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). The processing system 2 can include microprocessor(s), memory, support circuits, IO circuits, and the like. In examples described herein, the processing system 2 includes a system memory management unit (SMMU) 80. The SMMU 80 is a separate memory management unit for use by PS and PL masters that do not have a built-in MMU. The NoC 82 includes circuitry for providing physical and logical connections between configured and/or hardened circuits in the programmable IC 1.

Figure 2:
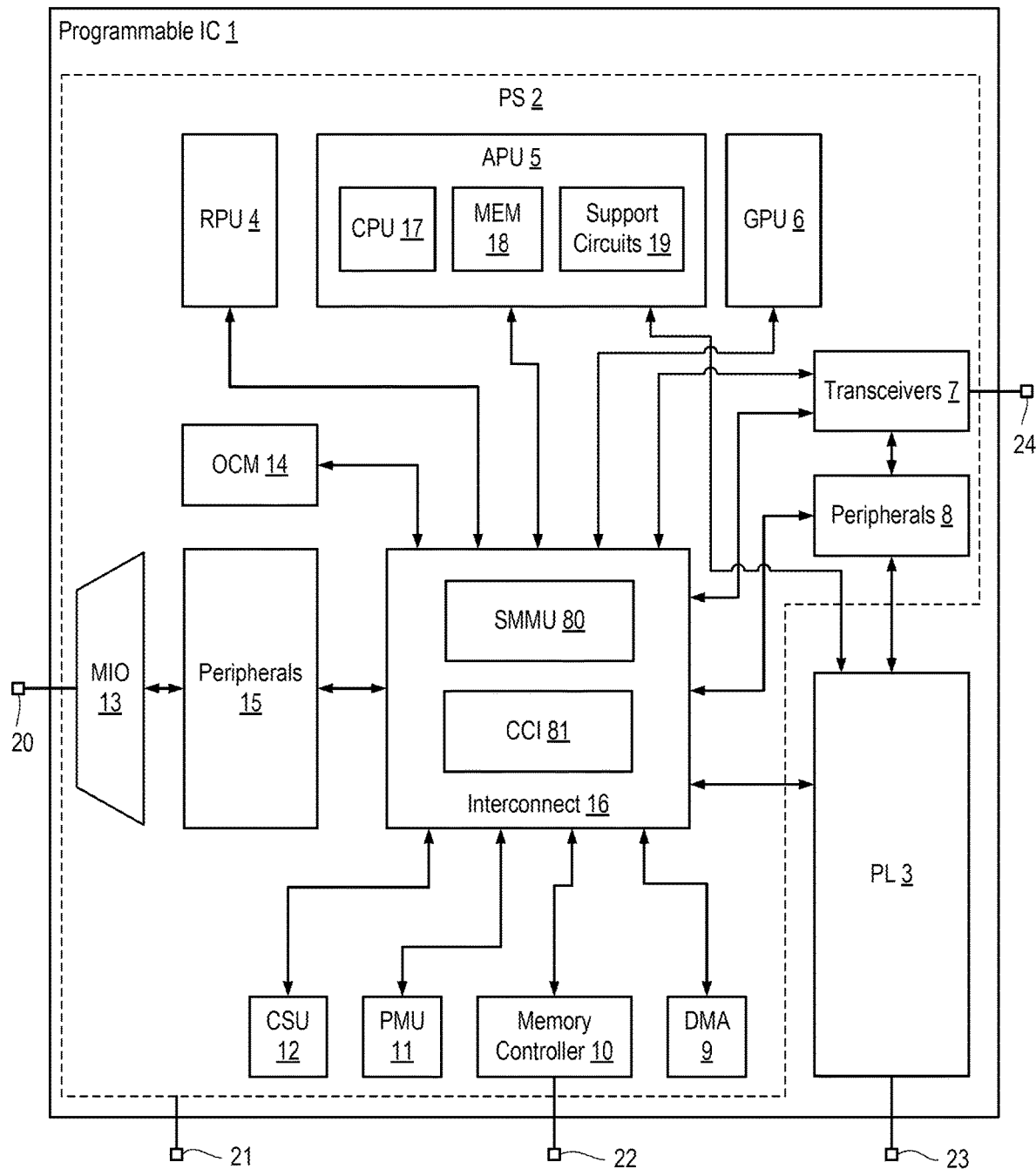
FIG. 2 is a block diagram depicting a System-on-Chip (SoC) implementation of the programmable IC of FIG. 1 according to an example.

FIG. 2 is a block diagram depicting a System-on-Chip (SoC) implementation of the programmable IC 1 according to an example. In the example, the programmable IC 1 includes the processing system 2 and the programmable logic 3. The processing system 2 includes various processing units, such as a real-time processing unit (RPU) 4, an application processing unit (APU) 5, a graphics processing unit (GPU) 6, a configuration and security unit (CSU) 12, a platform management unit (PMU) 122, and the like. The processing system 2 also includes various support circuits, such as on-chip memory (OCM) 14, transceivers 7, peripherals 8, interconnect 16, DMA circuit 9, memory controller 10, peripherals 15, and multiplexed IO (MIO) circuit 13. The processing units and the support circuits are interconnected by the interconnect 16. The PL 3 is also coupled to the interconnect 16. The transceivers 7 are coupled to external pins 24. The PL 3 is coupled to external pins 23. The memory controller 10 is coupled to external pins 22. The MIO 13 is coupled to external pins 20. The PS 2 is generally coupled to external pins 21. The APU 5 can include a CPU 17, memory 18, and support circuits 19. The APU 5 can include other circuitry, including L1 and L2 caches and the like. The RPU 4 can include additional circuitry, such as L1 caches and the like. The interconnect 16 can include cache-coherent interconnect (CCI) 81. In the example, the interconnect 16 includes an embedded SMMU 80 for memory virtualization.

Referring to the PS 2, each of the processing units includes one or more central processing units (CPUs) and associated circuits, such as memories, interrupt controllers, direct memory access (DMA) controllers, memory management units (MMUs), floating point units (FPUs), and the like. The interconnect 16 includes various switches, busses, communication links, and the like configured to interconnect the processing units, as well as interconnect the other components in the PS 2 to the processing units. In an example, the interconnect 16 uses advanced eXtensible interface (AXI) channels for communicating addresses, data, and response transactions between master and slave clients. For example, the interconnect 16 can implement busses/interfaces defined in the ARM® Advanced Microcontroller Bus Architecture (AMBA) 4 specifications, including AXI coherency extensions (ACE), AXI coherency extensions lite (ACE-Lite), AXI4, AXI4-Lite, and AXI4-Stream. While the interconnect 16 is described herein as using AXI channels for communicating addresses, data, and responses transactions, those skilled in the art will appreciate that other types of on-chip interconnects can be used. The interconnect 16 can implement a full array of interconnect communications capabilities and overlays for quality of service (QoS), debug, and test monitoring. The CCI 81 combines parts of the interconnect 16 and coherency functions. The CCI 81 can provide ports for full coherency, where coherent masters connected to the CCI 81 can snoop each other's caches. The CCI 81 can also provide input/output (IO) coherency, where IO coherent masters can snoop APU 5 caches, avoiding the need for the software to provide coherency by flushing APU 5 caches. The SMMU 80 is described further below.

The OCM 14 includes one or more RAM modules, which can be distributed throughout the PS 2. For example, the OCM 14 can include battery backed RAM (BBRAM), tightly coupled memory (TCM), and the like. The memory controller 10 can include a DRAM interface for accessing external DRAM. The peripherals 8, 15 can include one or more components that provide an interface to the PS 2. For example, the peripherals 132 can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose IO (GPIO) ports, serial advanced technology attachment (SATA) ports, PCIe ports, and the like. The peripherals 15 can be coupled to the MIO 13. The peripherals 8 can be coupled to the transceivers 7. The transceivers 7 can include serializer/deserializer (SERDES) circuits, MGTs, and the like.

Figure 3:
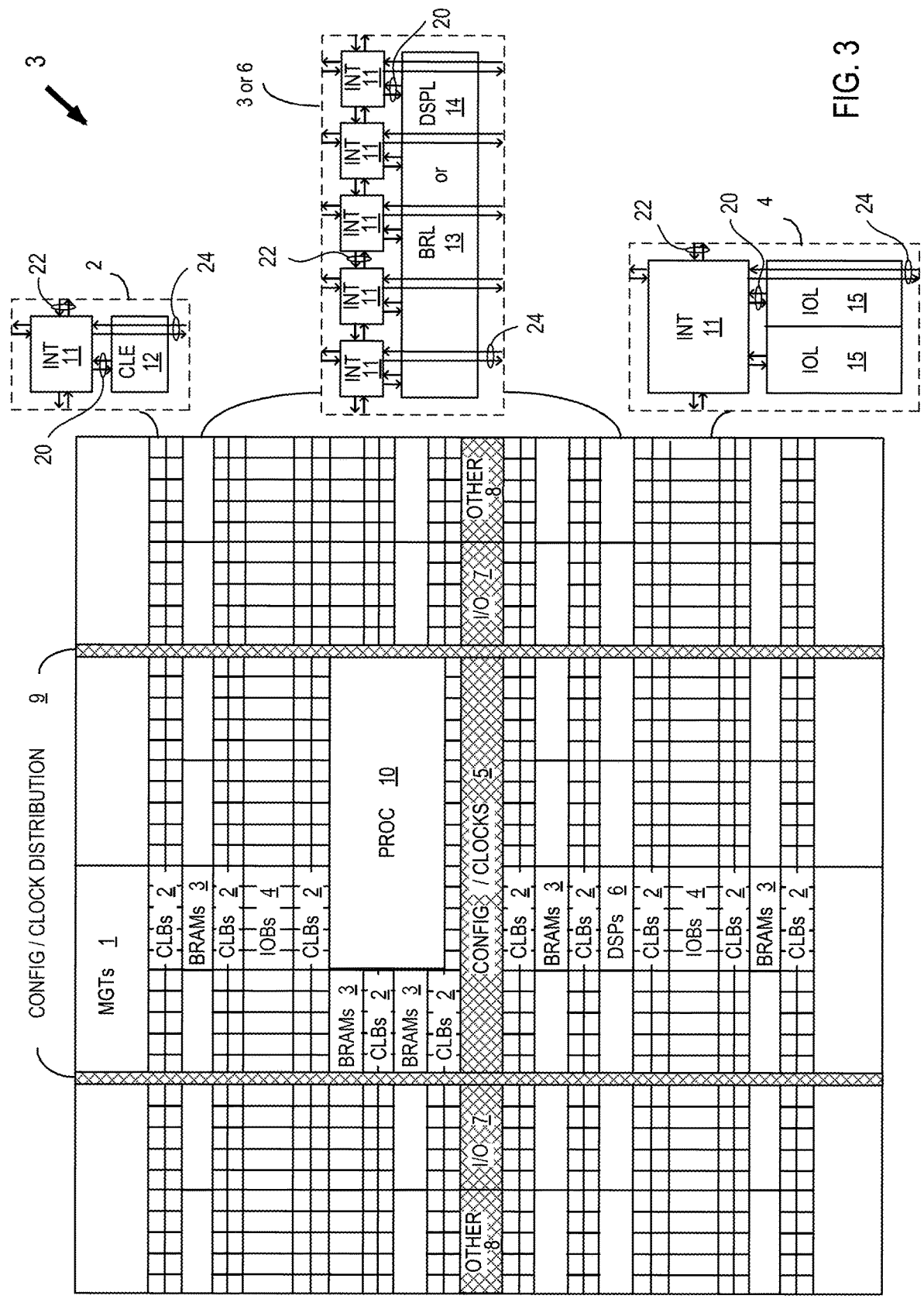
FIG. 3 illustrates programmable logic of the programmable IC of FIG. 1 according to an example.

FIG. 3 illustrates programmable logic 3 of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The programmable logic 3 can also include PCIe interfaces 40, analog-to-digital converters (ADC) 38, and the like.

In some programmable logic, each programmable tile can include at least one programmable interconnect element ("INT") 43 having connections to input and output terminals 48 of a programmable logic element within the same tile, as shown by examples included at the top of FIG. 3. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated programmable logic.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 3) is used for configuration, clock, and other control logic. Vertical columns 51 extending from this horizontal area or column are used to distribute the clocks and configuration signals across the breadth of the programmable logic.

Some programmable logic utilizing the architecture illustrated in FIG. 3 include additional logic blocks that disrupt the regular columnar structure making up a large part of the programmable logic. The additional logic blocks can be programmable blocks and/or dedicated logic.

Note that FIG. 3 is intended to illustrate only an exemplary programmable logic architecture. For example, the numbers of logic blocks in a row, the relative width of the rows, the number and order of rows, the types of logic blocks included in the rows, the relative sizes of the logic blocks, and the interconnect/logic implementations included at the top of FIG. 3 are purely exemplary. For example, in an actual programmable logic more than one adjacent row of CLBs is typically included wherever the CLBs appear, to facilitate the efficient implementation of user logic, but the number of adjacent CLB rows varies with the overall size of the programmable logic.

Figure 4:
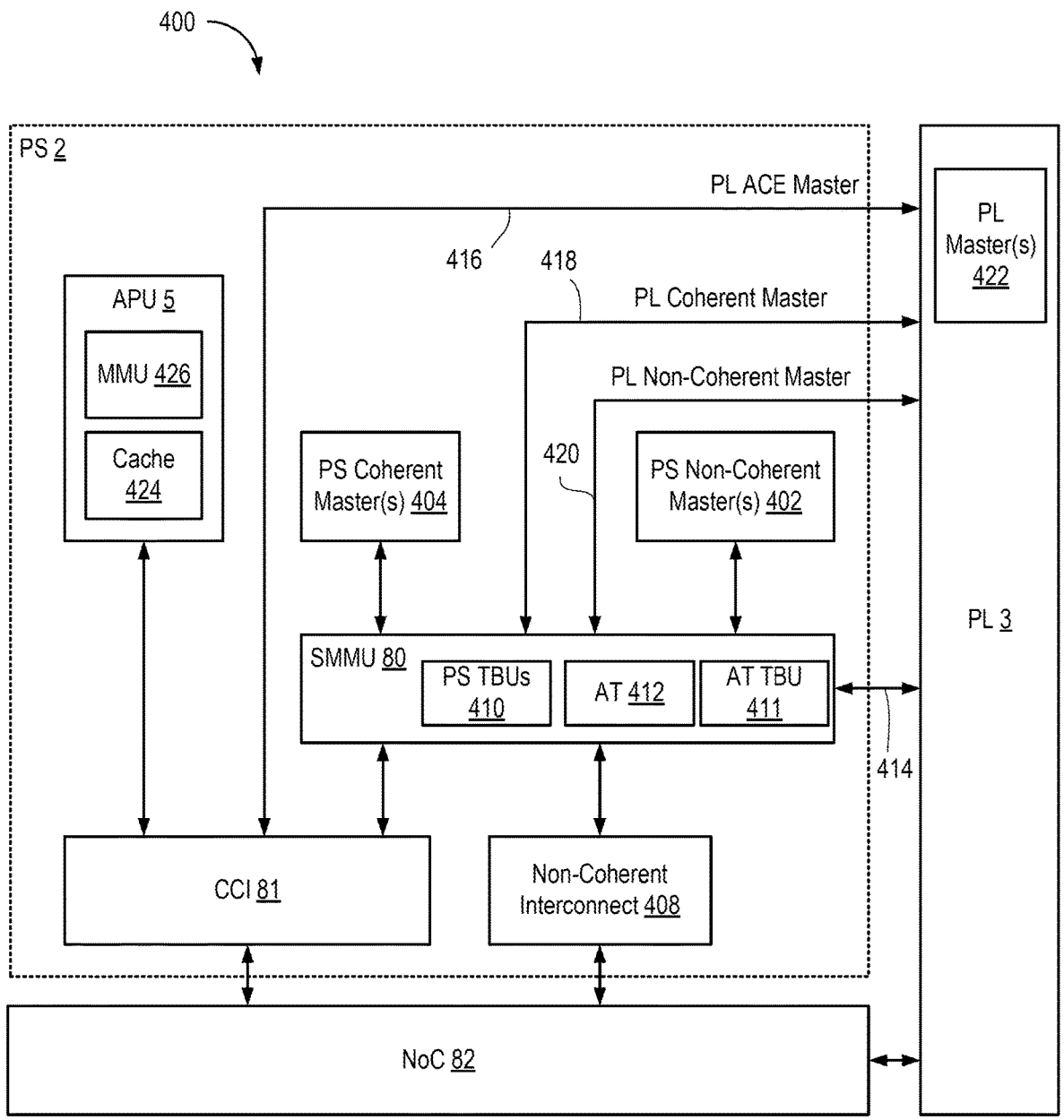
FIG. 4 is a block diagram depicting a PS-PL system in a programmable IC according to an example.

FIG. 4 is a block diagram depicting a PS-PL system 400 in the programmable IC 1 according to an example. The PS-PL system 400 includes the PS 2, the NoC 82, and the PL 3. The PS 2 includes the APU 5, the SMMU 80, the CCI 81, non-coherent interconnect 408, one or more PS coherent masters 404, and one or more PS non-coherent masters 402. The APU 5, the SMMU 80, and the PL 3 are coupled to the CCI 81. The SMMU 80 is coupled to the non-coherent interconnect 408. The PS coherent master(s) 404, the PS non-coherent master(s) 402, and the PL 3 are coupled to the SMMU 80. The SMMU 80 includes a plurality of PS translation buffer circuits 410 (referred to as translation buffer units (TBUs)), an address translator circuit (AT) 412, and an AT TBU 411. The PL 3 is coupled to the CCI 81 through a PL AXI ACE master interface 416, a PL coherent master interface 418, and a PL non-coherent master interface 420. The PL 3 is also coupled to the SMMU 80 through an AT interface 414. The CCI 81, the non-coherent interconnect 408, and the PL 3 are coupled to the NoC 82. The PL 3 includes one or more PL masters 422, which can include coherent and/or non-coherent masters. The PL masters 422 can be hardened circuits in the PL 3 or circuits configured in programmable logic of the PL 3.

The APU 5 includes cache memory (cache 424) and a memory management unit (MMU) 426. The MMU 426 implements memory management in the form of paging of memory. The MMU 426 controls address translation and access permissions for memory accesses made by the APU 5. The MMU 426 implements a plurality of address translation schemes based on privilege level (also referred to as "translation schemes"). Each translation scheme generally takes an input address (IA) and, if permitted based on the defined access permissions, returns an output address (OA). If an address translation cannot be performed (e.g., due to violation of the access permissions), the MMU 426 generates an exception. The MMU 426 is controlled by a plurality system registers in the APU 5. The MMU 426 can include a translation lookaside buffer (TLB) that caches address translations for use by APU 5. The SMMU 80 operates similarly to the MMU 426 and implements the same address translation schemes.

One type of address translation scheme includes a single stage of address translation that receives a virtual address (VA) in a virtual address space and outputs a physical address (PA) in a physical address space. The virtual address space is a flat logical address space managed by software. The physical address space includes the physical memory map that includes the memory. Another type of translation scheme includes two stages of address translation. The first stage of address translation receives a VA and outputs an intermediate physical address (IPA) in an intermediate physical address space. The second stage of address translation receives an IPA and outputs a PA. The IPA address space is a flat logical address space managed by software.

The CCI 81 provides for hardware cache coherency between coherent masters connected thereto. The non-coherent interconnect 408 does not have a cache coherency function. In the example, coherent masters include the APU 5, the PS coherent master(s) 404, and optionally PL master (s) 422. Each of the PS non-coherent master(s) 402, and any non-coherent PL master(s) 422, do not require cache coherency functionality and can communicate through the non-coherent interconnect 408.

The PS coherent master(s) 404 and the PL coherent master interface 418 are coupled to the SMMU 80 through the PS TBUs 410 that operate in the clock domain of the PS 2. The AT interface 414 is coupled to the AT TBU 411, which operates in the clock domain of the PL 3. The AT 412 is configured to perform address translations for the PL masters 422 using request/response communication over the address translation interface 414. Notably, in examples, the PL master(s) 422 do not direct their traffic (other than address translation requests) through the PS 2 in order to translate virtual addresses. Further, no traffic other than address translation requests flows through the AT interface 414. The AT 412, the AT interface 414, and the AT TBU 411 operate in the clock domain of the PL 3, thus eliminating latency due to clock domain crossing.

Figure 5:
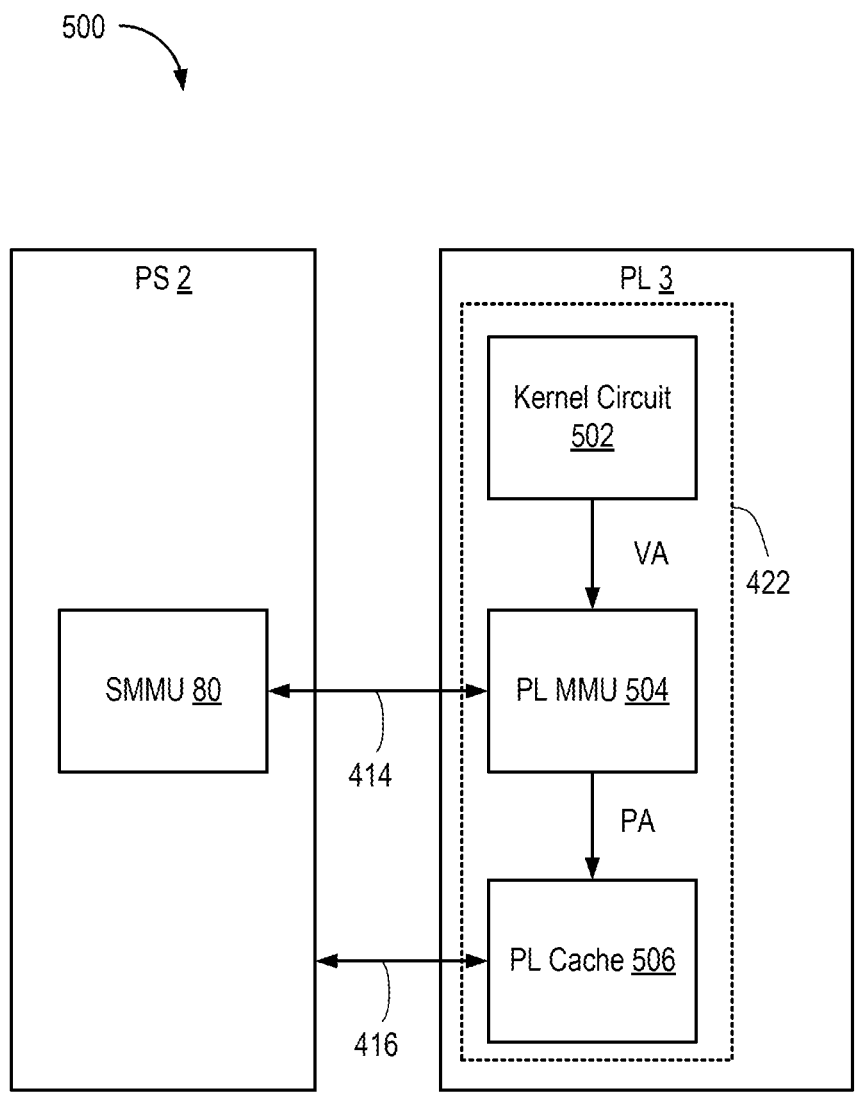
FIG. 5 is a block diagram depicting an example system that makes use of an address translation interface to the SMMU according to the example.

FIG. 5 is a block diagram depicting an example system 500 that makes use of the AT interface 414 to the SMMU 80 according to the example. In the example, the PL 3 includes a PL master 422 having a kernel circuit 502, a PL MMU 504, and a PL cache memory (PL cache 506). The kernel circuit 502 can be a hardened circuit or a circuit configured in programmable logic. Likewise, the PL MMU 504 can be a hardened circuit or a circuit configured in programmable logic. The PL cache 506 comprises random access memory (RAM) disposed in the PL 3 (e.g., BRAM). The PL MMU 504 is coupled to the SMMU 80 in the PS 2 through the AT interface 414. The PL cache 506 is coupled to the PS 2 through the PL ACE master interface 416.

In operation, the kernel circuit 502 issues a request to translate a virtual address (VA) to the PL MMU 504. The PL MMU 504 does not include a local TLB and thus, in the example, does not cache address translations. Rather, the PL MMU 504 forwards all VA translation requests to the SMMU 80 through the AT interface 414 using AT requests. Thus, there is no need for distributed virtual memory (DVM) transaction support in the kernel circuit 502.

Figure 6:
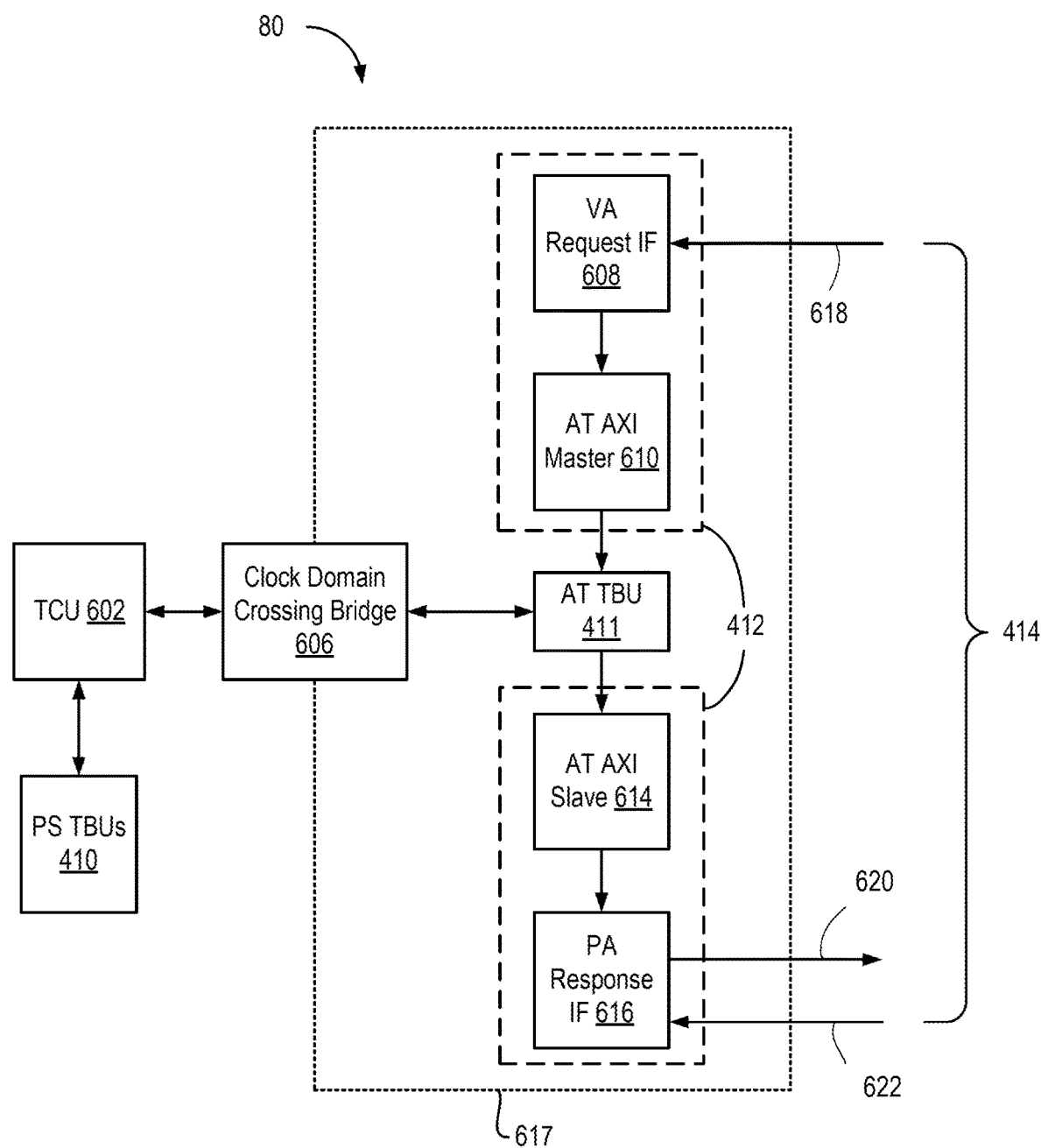
FIG. 6 is a block diagram depicting an SMMU according to an example.

FIG. 6 is a block diagram depicting the SMMU 80 according to an example. The SMMU 80 includes a translation control circuit 602 (referred to herein as a translation control unit (TCU)), the PS TBUs 410, a clock domain crossing bridge 606, the AT 412, and the AT TBU 411. The AT 412 includes a VA request interface (IF) 608, an address translation (AT) AXI master 610, an AT AXI slave 614, and a PA response IF 616. The VA request IF 608, the AT AXI master 610, the AT TBU 411, the AT AXI slave 614, and the PA response IF 616 operate in the clock domain of the PL (shown as a clock domain 617). The TCU 602 and the PS TBUs 410 operate in the clock domain of the PS 2. The clock domain crossing bridge 606 is configured to translate between the clock domain of the PS 2 and the clock domain of the PL for communications between the TCU 602 and the AT TBU 411.

In an example, the AT interface 414 includes two independent channels, one each for read and write translation requests. Each of the read and write channels includes an AT request sub-channel and an AT response sub-channel. In some examples, each read and write channel further includes an AT completion sub-channel. The VA request IF 608 is configured to receive from AT request sub-channels 618. The PA response IF 616 is configured to transmit on AT response sub-channels 620. The PA response IF 616 is also configured to receive on AT completion sub-channels 622 (if present).

The AT request sub-channel is used to request address translation of a virtual address. In an example, the AT request sub-channel includes, among other signals, an address signal and an AXI ID signal. The address signal supplies the virtual address to be translated. The AXI ID signal supplies an identifier for the AT request. In an example, the AT request sub-channel is implemented using an AXI streaming interface between the PL master 422 and the VA request IF 608.

The AT response sub-channel is used to provide the translated address and related parameters to the PL master 422. In an example, the AT response sub-channel includes, among other signals, a translated address signal, an AXI ID signal, and an error signal. The translated address signal supplies the translated address for the requested virtual address. The AXI ID signal supplies the identifier for the corresponding AT request. The error signal indicates whether a translation error occurred. In an example, the AT response sub-channel is implemented using an AXI streaming interface between the PL master 422 and the PA response IF 616.

The AT completion sub-channel can be used by the PL master 422 to notify the AT 412 that the PL master 422 has completed the transaction using the translated address (e.g., a read or write transaction to the memory). In an example, the AT completion sub-channel includes an AXI ID signal that supplies the identifier for the corresponding AT request. In an example, the AT completion sub-channel is implemented using an AXI streaming interface between the PL master 422 and the PA response IF 616. The AT completion sub-channel can be used when page tables are changed dynamically and DVM messaging between TBU and TCU may be used to invalidate TBU entries. Without the completion sub-channel, there is a race-condition hazard between the PL master 422 translated transaction and possible virtual memory reconfiguration done at the system level. In another example, if the use case involves only static virtual memory configuration, then no DVM invalidate events are expected. In this example, some performance increase may be achieved by avoiding the completion phase (e.g., completion bypass). Thus, implementation of the completion phase and use of the AT completion sub-channel is optional depending on whether the virtual memory configuration is static or dynamic.

Figure 7:
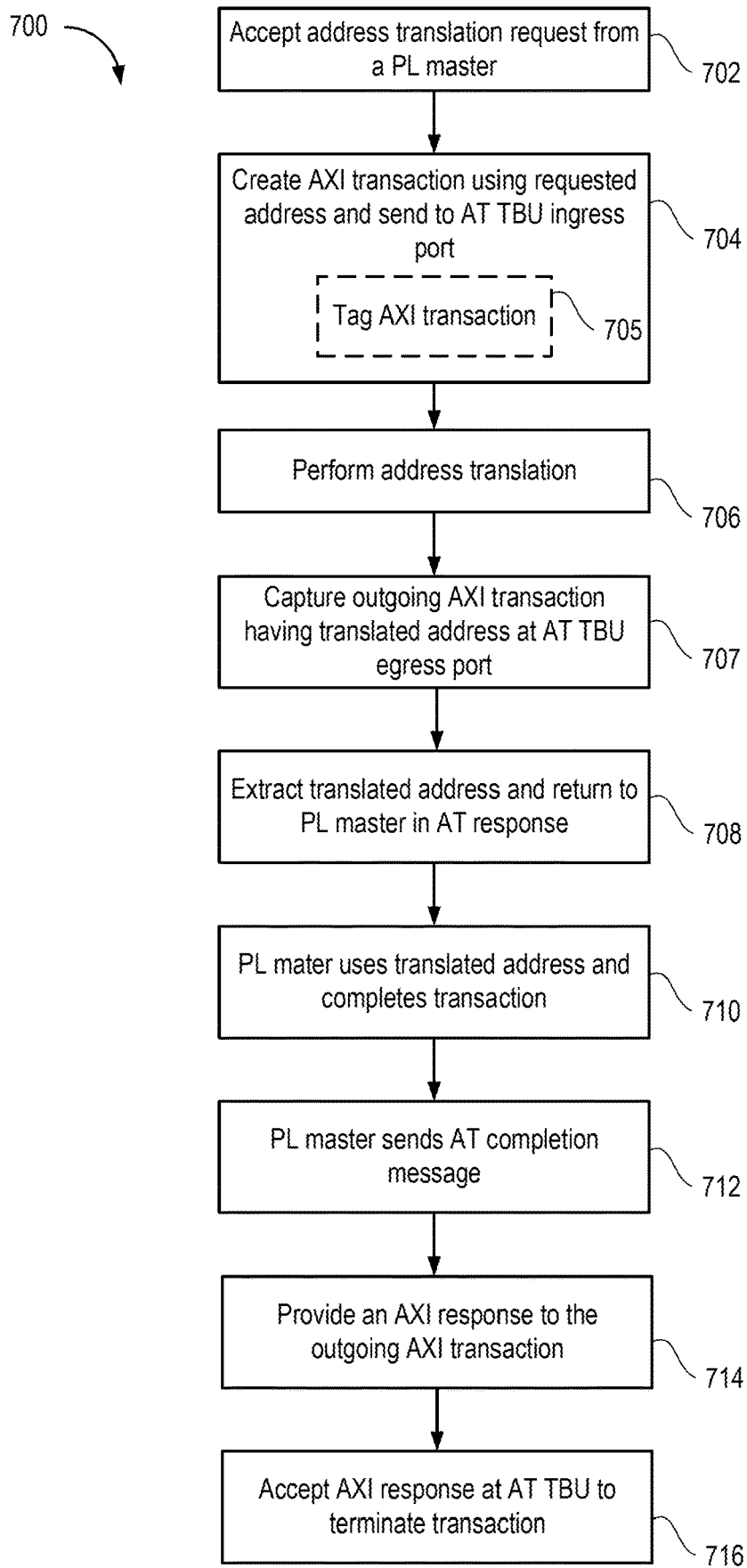
FIG. 7 is a flow diagram depicting a method of processing an AT request at an SMMU from a PL master according to an example.

FIG. 7 is a flow diagram depicting a method 700 of processing an AT request at the SMMU 80 from a PL master 422 according to an example. Aspects of the method 700 can be understood with reference to FIGS. 4-6 described above. The method 700 begins at step 702, where the VA request IF 608 accepts an AT request from the PL MMU 504 in the PL master 422. The VA request IF 608 forwards the AT request to the AT AXI master 610.

At step 704, the AT AXI master 610 creates an AXI transaction using the requested address. The AT AXI master 610 sends the AXI transaction that encapsulates the AT request to an ingress port of the AT TBU 411. At step 706, the AT TBU 411 performs the address translation. For example, if the AT TBU 411 includes a valid entry for the requested virtual address, the TBU 411 obtains a translated address from its TLB. If the AT TBU 411 does not include a valid entry for the virtual address, the AT TBU 411 forwards the request to the TCU 602 through the clock domain crossing bridge 606. The TCU 602 performs the address translation function based on page tables to obtain the translated address. The TCU 602 returns the translated address to the AT TBU 411 through the clock domain crossing bridge 606.

At step 707, the AT AXI slave 614 captures an outgoing AXI transaction having the translated address from the AT TBU 411. At step 708, the PA response IF 616 extracts the translated address from the outgoing AXI transaction. The PA response IF 616 returns the translated address to the PL MMU 504 in an AT response. The PL MMU 504 in turn returns the translated address to the kernel circuit 502. At step 710, the kernel circuit 502 uses the translated address and completes the transaction (e.g., a read or write memory transaction).

At step 712, the PL MMU 504 sends an AT completion message to the PA response IF 616 through the AT interface 414. The PA response IF 616 forwards the completion message to the AXI slave 614. At step 714, the AXI slave 614 provides an AXI response to the outgoing AXI transaction to the AT TBU 411. At step 716, the AT TBU 411 accepts the AXI response to terminate the transaction.

Figure 8:
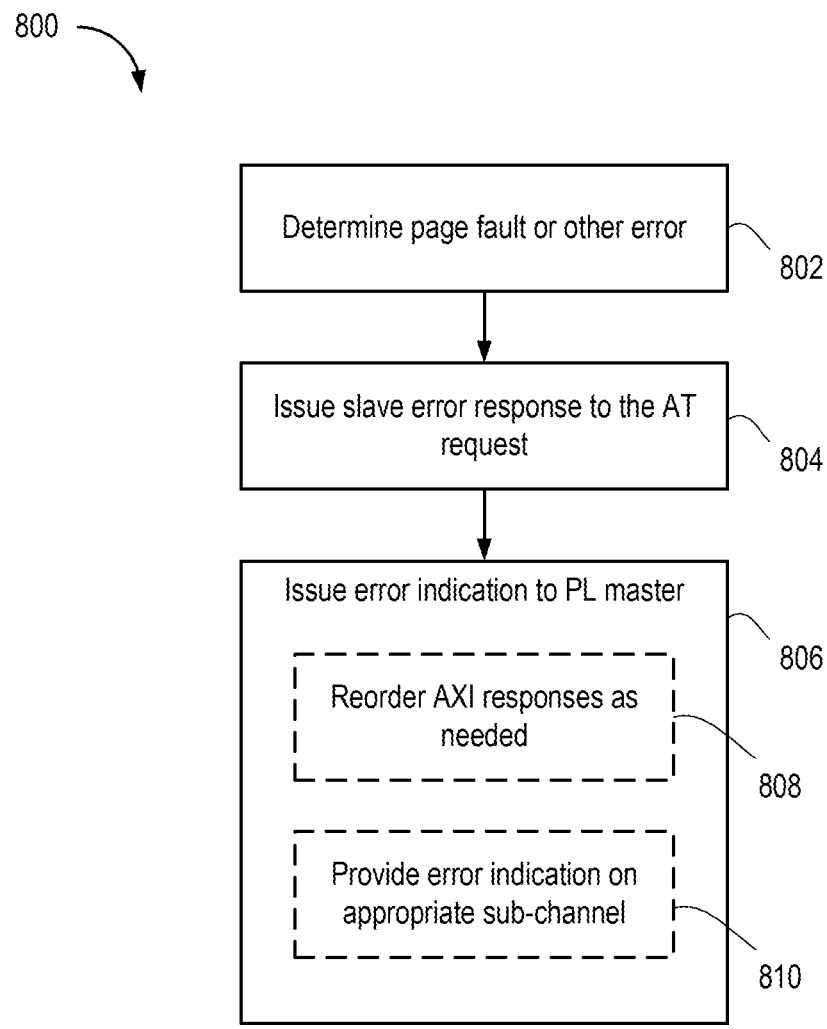
FIG. 8 is a flow diagram depicting a method of processing faults according to an example.

FIG. 8 is a flow diagram depicting a method 800 of processing faults according to an example. Aspects of the method 800 can be understood with reference to FIGS. 4-6 described above. The method 800 begins at step 802, where the TCU 602 determines a fault in response to a translation request (e.g., a page fault). At step 804, the AT TBU 411 issues a slave error response to the AT request. At step 806, the AXI slave 614 issues an AT response to the PL master 422 to indicate the error. Thus, if the translation request cannot be completed by the SMMU 80, the AT TBU 411 will issue a slave error response corresponding to the AXI request. The AXI slave 614 monitors the AT TBU 411 for such slave error responses (in addition to responses for successful translations). The AXI slave 614 generates a response based on both possible outcomes and AXI ordering rules must be maintained. The PL master 422 must not send an AT completion in the case of a translation failure.

For example, assume two back-to-back AT requests, R1 and R2, with the same AXI ID. R1 fails and appears as a slave error output from the AT TBU 411. R2 succeeds and appears as a translated request output from the AT TBU 411. It is unknown which will appear first at the AT TBU 411 interfaces. Correct AXI ordering can be achieved by tagging the AXI requests and reordering as needed. Thus, referring to FIG. 7, the AXI master 610 can tag the created AXI transaction when creating it in response to an AT request (step 705). For example, a 3-bit tag can be used to track up to eight outstanding transactions. The AXI slave 614 can determine the order of the responses based on the tags added by the AXI master 610. Thus, at step 808, the AXI slave 613 reorders the AXI responses as needed based on the tags.

In another example, the AXI master 610 does not tag the AXI requests. Rather, the PL master 422 must use unique AXI ID per AT request and is thus able to accept responses out of order. Rather than multiplexing together successful translations and fault errors onto the same AT response sub-channel, the AXI slave 614 can provide a separate error response sub-channel for providing the error responses to the PL master 422 (step 810).

While the foregoing is directed to specific examples, other and further examples may be devised without departing from the basic scope thereof, and the scope thereof is determined by the claims that follow.

What is claimed is:

1. An integrated circuit (IC), comprising;
a processing system having a processor, a master circuit, and a system memory management unit (SMMU), the SMMU including:
a first translation buffer unit (TBU) coupled to the master circuit;
a second TBU;
an address translation (AT) circuit, the AT circuit including a virtual address (VA) request interface and an AT master circuit, the AT master circuit coupled between the VA request interface and the second TBU; and
an AT interface coupled to the VA request interface of the AT circuit;
logic coupled to the AT circuit in the SMMU through the AT interface.

2. The IC of claim 1, wherein the AT circuit and the second TBU operate in a clock domain of the programmable logic and wherein the first TBU operates in a clock domain of the processing system.

3. The IC of claim 2, wherein the SMMU further includes a translation control unit (TCU) and a clock domain crossing bridge coupled between the second TBU and the TCU.

4. The IC of claim 1, wherein the AT circuit comprises:
a physical address (PA) response interface coupled to the AT interface; and
an AT slave circuit coupled between the PA response interface and the second TBU.

5. The IC of claim 4, wherein the AT interface includes an AT request sub-channel coupled to the VA request interface and an AT response sub-channel coupled to the PA response interface.

6. The IC of claim 5, wherein the AT interface further includes an AT completion sub-channel coupled to the PA response interface.

7. A circuit in an integrated circuit (IC), comprising:
programmable logic (PL) having a PL master circuit; and
a processing system (PS) having a system memory management unit (SMMU), the SMMU including:
a translation buffer unit (TBU);
an address translation (AT) circuit, the AT circuit including a virtual address (VA) request interface and an AT master circuit, the AT master circuit coupled between the VA request interface and the TBU; and
an AT interface coupled between the PL master circuit and the VA request interface of the AT circuit.

8. The circuit of claim 7, wherein the AT circuit and the TBU operate in a clock domain of the programmable logic.

9. The circuit of claim 8, wherein the SMMU further includes a translation control unit (TCU) and a clock domain crossing bridge coupled between the TBU and the TCU, wherein the TCU operates in a clock domain of the PS.

10. The circuit of claim 7, wherein the AT circuit comprises:
a physical address (PA) response interface coupled to the AT interface; and
an AT slave circuit coupled between the PA response interface and the TBU.

11. The circuit of claim 10, wherein the AT interface includes an AT request sub-channel coupled to the VA request interface and an AT response sub-channel coupled to the PA response interface.

12. The circuit of claim 11, wherein the AT interface further includes an AT completion sub-channel coupled to the PA response interface.

13. The circuit of claim 7, wherein the PL master circuit comprises:
a kernel circuit;
a PL memory management unit (MMU) coupled to the kernel circuit and the SMMU through the AT interface; and
a PL cache coupled to the PL MMU.

14. The circuit of claim 13, wherein the kernel circuit is configured to provide a virtual address to the PL MMU, wherein the PL MMU is configured to provide a request to translate the virtual address to the SMMU through the AT interface, and wherein the PL MMU is configured to receive a translated address from the SMMU and to provide the translated address to the kernel circuit.

15. A method of address translation in an integrated circuit (IC), comprising:
receiving, at a system memory management unit (SMMU) in a processing system (PS) of the IC, a request to translate a virtual address from a master circuit in programmable logic (PL) of the programmable IC;
translating the virtual address at the SMMU; and
sending a translated address from the SMMU to the master circuit in the PL by capturing an outgoing transaction from a TBU having the translated address, extracting the translated address from the outgoing transaction, and returning the translated address from the AT circuit to the master circuit in the PL.

16. The method of claim 15, wherein the step of receiving comprises:
creating, at an address translation (AT) circuit in the SMMU, a transaction using the virtual address; and
sending the transaction to the translation buffer unit (TBU) in the SMMU.

17. The method of claim 15, further comprising:
using the translated address at the master circuit in the PL;
providing a completion message to the SMMU from the master circuit in the PL.

18. The method of claim 17, further comprising:
providing, from the AT circuit, a response to the outgoing transaction to the TBU.

19. The method of claim 15, further comprising:
receiving at the SMMU a second request to translate another virtual address from the master circuit;
determining at the SMMU an error in response to the second request; and
sending an error indication from the SMMU to the master circuit.

* * * * *